US006420880B1

(12) United States Patent
Miller

(10) Patent No.: US 6,420,880 B1
(45) Date of Patent: Jul. 16, 2002

(54) METHOD AND ARRANGEMENT FOR DIELECTRIC INTEGRITY TESTING USING PLL LOOP CAPACITOR

(75) Inventor: Edward E. Miller, Tempe, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/404,550

(22) Filed: Sep. 23, 1999

(51) Int. Cl.[7] .............................................. G01R 31/26
(52) U.S. Cl. ........................ 324/537; 324/719; 324/658
(58) Field of Search ................................. 324/550, 537, 324/719, 765, 548, 713, 716, 658, 452, 649

(56) References Cited

U.S. PATENT DOCUMENTS

| 5,023,561 | A |   | 6/1991 | Hillard ........................ 324/719 |
| 5,598,102 | A |   | 1/1997 | Smayling et al. ............ 324/537 |
| 5,786,689 | A |   | 7/1998 | Kimura .................... 324/158.1 |
| 6,014,034 | A | * | 1/2000 | Arora et al. ................. 324/769 |
| 6,047,243 | A | * | 4/2000 | Bang et al. .............. 324/452 X |
| 6,049,213 | A | * | 4/2000 | Abadeer ...................... 324/719 |
| 6,111,423 | A | * | 8/2000 | Imoto .......................... 324/769 |

OTHER PUBLICATIONS

Mijuskovic, Dejan, "On–Chip Capacitance Measurement Method", *Motorola Technical Developments*, Jul. 1991, pp. 120–121.

* cited by examiner

Primary Examiner—Diego Gutierrez
Assistant Examiner—T. R. Sundaram
(74) Attorney, Agent, or Firm—Peter Zawilski

(57) ABSTRACT

A semiconductor testing process effectively determines the integrity of a large capacitive structure buried within an integrated circuit. According to one example embodiment, a process of testing the oxide integrity of a circuit involves selecting a large gate oxide structure or structures that can be isolated from leakage paths. The dielectric integrity of the structure is tested by stressing the structure via voltage settings, comparable to a supply voltage, across its two terminals. The structure is connected to a current-sensitive node in-the integrated circuit across the two terminals. Other circuits connected to the current-sensitive node are shut off so that the current-sensitive node should be an island relative to other current paths. The leakage current at the current-sensitive node is then measured and compared with a reference level. From the measurements and comparison, a quality factor indicative of the dielectric integrity in the structure is determined.

20 Claims, 3 Drawing Sheets

METHOD AND ARRANGEMENT FOR DIELECTRIC INTEGRITY TESTING USING PLL LOOP CAPACITOR

FIELD OF THE INVENTION

This invention relates to semiconductor devices and their manufacture and, more particularly, to the testing of such devices including the area of gate dielectric integrity testing.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, manufacturing processes becomes more difficult. As the manufacturing processes become more difficult, the importance of accurate testing procedures increases significantly.

A large variety of semiconductor devices have been manufactured having various applications in numerous disciplines. Such semiconductor devices generally include a semiconductor substrate on which active devices and passive devices are formed. Such active silicon-based devices often include metal-oxide-semiconductor (MOS) transistors, such as p-channel MOS (PMOS), n-channel MOS (NMOS) and complimentary MOS (CMOS) transistors, bipolar transistors, BiCMOS transistors. While the particular structures of a given active device can vary between device types, a MOS transistor generally includes source and drain regions and a gate electrode that modulates current in a channel between the source and drain regions. The gate electrode is typically insulated from the source and drain regions and the channel using a dielectric, such as an oxide.

A common passive semiconductor device is a capacitive device, or capacitor. The structure of a typical capacitive device includes, for example, two gate electrodes separated by a dielectric, such as an oxide. In integrated circuits, capacitive devices are commonly implemented using a MOS transistor with its source and drain terminals interconnected. For the device to function properly, the dielectric acts to prevent a voltage differential between the two terminals from discharging directly from terminal to another.

In the manufacture of such integrated circuits, several different types of tests are required to ensure the quality of the product. One important test is to ensure the integrity of the gate oxide. A typical gate oxide integrity test is performed on a process monitor, which is a test structure placed next to circuit die locations on the silicon wafer. The oxide quality is assessed by stressing the oxide using the maximum allowable voltage across the oxide and comparing the measured leakage current to an acceptance limit that is based on the area of the gate oxide test device and other factors which define acceptable versus unacceptable leakage levels.

Modern integrated circuits are dominated by digital logic area, although more analog functions are being incorporated into the circuits. This trend will continue as the "system-on-a-chip" concept draws more and more functionality into a single integrated circuit design. In establishing acceptable leakage levels, analog and digital requirements diverge. The dominant digital logic can withstand a certain amount of leakage in the transistors and remain fully functional. This leakage is undesirable since standby currents increase dramatically. However, the circuits can still function normally at leakage levels which are unacceptable for analog circuitry. Since the digital logic dominates current integrated circuit designs, the leakage test structures are sized to adequately measure leakage for the digital logic.

Analog functional blocks, such as a phase-locked loop (PLL), suffer from bias shifts and leakage from high-impedance nodes and, at these leakage levels, the digital logic areas are not impacted. In analog blocks, this leakage can, and usually does, result in significant performance degradation. Therefore, the normal gate oxide leakage screening levels may not be sufficiently stringent to flag problems in analog blocks. PLLs and other functional blocks that contain large integrated capacitors are especially susceptible to gate oxide leakage. To achieve an acceptable capacitance value within a reasonable amount of silicon area, these large integrated capacitors are commonly built using gate oxide. For this reason, gate oxide leakage can be an important factor for large integrated capacitors. A particular type of fully-integrated PLL contains a large loop filter capacitor for which leakage current well below 0.1 nanoamp per 100 picofarads may be required.

As more devices are required to be fit into smaller areas of silicon, the device sizes will continue to shrink with each new generation of technology. With each new generation, the logic gate oxide area shrinks per individual device, but the analog transistor gate oxide area is often driven by other factors, such as tight matching and a stringent noise budget. The factors require that the analog transistor not scale in size with the digital transistors. The required capacitance area is set by the design value of the capacitance in picofarads. This capacitance area also does not scale with the digital logic. For these reasons, test structures may diverge from the needs of analog functional blocks.

SUMMARY

According to various aspects of the present invention, embodiments thereof are exemplified in the form of methods and arrangements concerning dielectric integrity testing of semiconductor structures. One specific implementation is directed to a process of testing the dielectric integrity of a capacitive structure coupled to a current-sensitive node in a semiconductor device. The process involves stressing the capacitive device by presenting a voltage differential across its terminals; isolating the current-sensitive node from other current paths; measuring the leakage current at the current-sensitive node; comparing the measured leakage current at the current-sensitive node with a reference level; and determining therefrom a quality factor indicative of the dielectric integrity in the capacitive device.

A more specific implementation of the present invention is directed to a method for testing dielectric integrity in a PLL capacitor circuit that forms part of controlled oscillator PLL circuit having a test mode. The PLL capacitor circuit has a capacitive device coupled between two terminals and coupled to a current-sensitive node in the controlled oscillator PLL circuit. The method involves: causing the controlled oscillator PLL circuit to enter the test mode; while in the test mode, stressing the capacitive device by presenting a voltage differential comparable to a supply voltage across the two terminals; isolating the current-sensitive node from other current paths; measuring the leakage current at the current-sensitive node; comparing the measured leakage current at the current-sensitive node with a reference level and determining therefrom a quality factor indicative of the dielectric integrity in the capacitive device.

The above summary is not intended to provide an overview of all aspects of the present invention. Other aspects of

BRIEF DESCRIPTION OF THE DRAWINGS

Various aspects and advantages of the present invention will become apparent upon reading the following detailed description of various embodiments and upon reference to the drawings in which.

Figure 1:
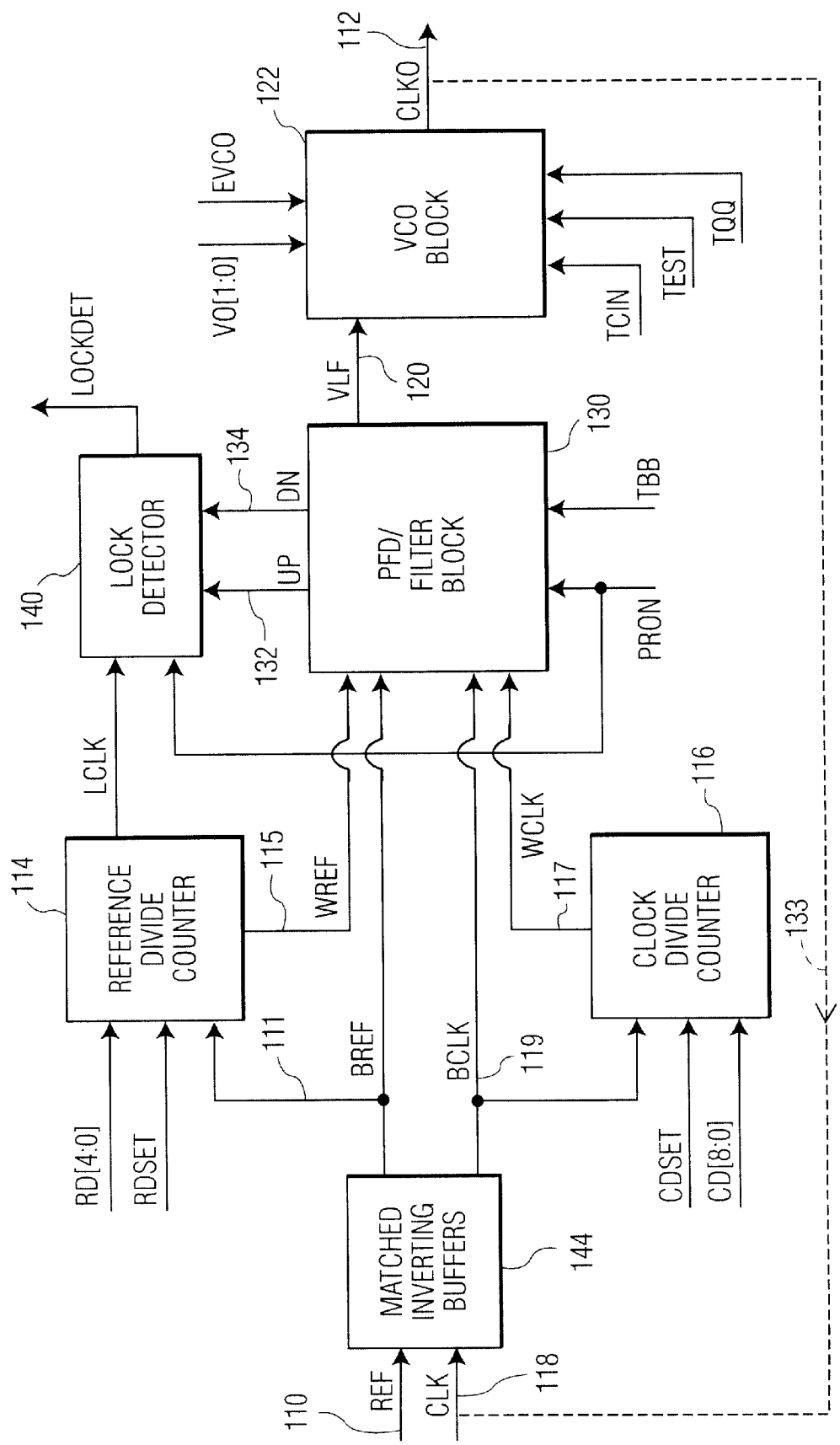
FIG. 1 is a block diagram of a phase-locked loop (PLL) circuit useful in illustrating a specific example implementation of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention has a variety of semiconductor circuit applications and has been found to be particularly advantageous for use in connection with analog circuits (or blocks) that include relatively large capacitive structures, such as capacitors built using thin gate oxide for maximum capacitance per unit area. Discoveries made in connection with the present invention first involved a frequency synthesis phase-locked loop (PLL) circuit arrangement. While the present invention is not necessarily limited to such a circuit, various aspects of the invention can be appreciated through a discussion of example embodiments operating in such an environment.

According to one example embodiment of the present invention, a process of testing the oxide integrity of a circuit involves selecting the largest gate oxide structure or structures that can be isolated from leakage paths and, if the circuit is to be used after testing, that can be used without adversely impacting its performance. In one implementation, the dielectric integrity of a capacitor is tested by stressing the device via voltage settings, comparable to a supply voltage, across its two terminals. The capacitor is connected to a current-sensitive node in the integrated circuit across the two terminals. Other circuits connected to the current-sensitive node are shut off so that the current-sensitive node should be an island relative to other current paths. The leakage current at the current-sensitive node is then measured and compared with a reference level. Therefrom, a quality factor indicative of the dielectric integrity in the capacitor is determined.

Turning now to the figures, FIG. 1 illustrates a frequency synthesis PLL circuit including several functional blocks that interact to perform the desired function of frequency synthesis. Frequency synthesis is the generation of one frequency from an applied input frequency reference. In the PLL of FIG. 1, the frequency reference is the REF input 110. The PLL is a feedback system in which the PLL output clock CLKO, depicted as 112, is driven to be phase and frequency locked to the REF input 110. Matched input buffers 144 provide buffered copies of the REF and CLK inputs 110 and 118 as BREF and BCLK signals at nodes 111 and 119, respectively. The phase relationship between CLK and REF is maintained with these buffered copies, and the PLL circuit of FIG. 1 actually phase locks BCLK at node 119 to BREF at node 111. This corresponds to locking CLK at input 118 to REF at input 110 for properly designed buffers 144.

The frequency at CLKO 112 is set by the frequency of the REF input 110 and two programmable divide-by-N counters, the reference divide counter (RDC) 114 and the clock divide counter (CDC) 116. Each counter outputs a pulse that corresponds functionally to a carry output of a standard counter, active for one period of its input clock. Therefore, if "M" is the count programmed into the RDC 114, then every M periods of REF (or BREF), a pulse is active on line WREF (node 115) for one period of REF. Similarly, if "N" is the count programmed into CDC 116, then every N periods of CLK (or BCLK), a pulse is active on line WCLK (node 117) for one period of CLK.

The pulses at WREF 115 and WCLK 117 act in conjunction with BCLK 119 and BREF 111 to control the operation of the PFD/filter block 130. Other connection schemes for the counters and input signals CLK and REF can be used, depending on the requirements for the PLL circuit, such as using the WCLK and WREF signals directly without requiring CLK and REF at the PFD/filter. Also, the PFD/filter block 130 is not needed when there is a precise phase alignment. In this instance, only the frequency at CLKO is important. In each of these example approaches, the feedback loop via a path 133 is formed when the PLL output clock CLKO 112 is tied to the input CLK line 118 as shown using the dotted lines of FIG. 1. Alternate connection schemes are often used, examples of which include clock buffer trees that result in delay between CLKO and CLK having a known purpose. As with conventional PLL implementations, once the feedback loop is closed, the output frequency at CLKO 112 is defined as:

$$F(\text{CLKO}) = (N/M) * F(\text{REF}),$$

where N and M are defined above.

The PFD/filter block 130 of FIG. 1 includes three functional blocks (not shown in FIG. 1). These blocks are a phase-frequency detector (PFD) that outputs an error pulse whose width is equal to the phase error between the REF input 110 and the CLK input 118; a charge pump that is driven by the PFD error pulse and that pumps current pulses into a loop filter; and a loop filter consisting of a loop capacitor in series with a resistor, and usually a smaller capacitor implemented to perform a smoothing function.

The PFD error pulses are generated by the PFD block 130 comparing the phase alignment of a selected edge of the BCLK signal 119 to a selected edge of the BREF signal 111. This corresponds to comparing CLK input 118 to REF input 110. In this particular PLL implementation, RDC 114 controls the selection of the appropriate BREF edge by the WREF signal 115, and the CDC 116 controls the selection of the appropriate BCLK edge by the WCLK signal 117. The PFD produces error pulses UP 132 and DN 134, which drive the charge pump (not shown) and the lock detector 140. The difference in the width of pulses UP 132 and DN 134 reflects the phase error between CLK input 118 and REF input 110 as shown in the expression:

$$PW(UP) - PW(DN),$$

where PW is shorthand for pulse width. The lock detector 140 provides a signal that can be sampled outside the PLL block, so that the system user(s) can determine whether the PLL circuit is functioning properly. Typical sampling techniques include using a state machine that alerts the system of a failure mode or using a software routine controlled by the system processor.

The charge pump is controlled by the UP 132 and DN 134 pulses from the PFD such that it injects a charge packet into the loop filter proportional to the phase error between the PFD inputs BREF and BCLK. The charge packet value can be expressed as:

$$I * [PW(UP) - PW(DN)],$$

where I is the charge pump current. After acquiring phase lock, this pulse-width difference is relatively small, for example, usually less than one nanosecond. Except for this short pump time, the PFD outputs are inactive, so the loop filter holds the voltage at the VLF node 120 until the next PFD cycle generates the next correction pulse.

The voltage at VLF node 120 is the loop filter voltage. This node is the voltage that establishes the bias current into the VCO (voltage-controlled oscillator) 122 to set the oscillation frequency. Any leakage current at VLF node 120 directly results in drift at the VCO output. Even a small leakage can result in phase error that is correctable by the feedback loop, resulting in an undesirable increased jitter that is tolerable for some applications. Since the leakage error accumulates for the entire PFD cycle (less the width of the correction pulses), even very small leakage can cause performance degradation. Where phase lock is critical to the application, the gate oxide integrity should be confirmed or else the PLL phase alignment will fail. This is because the PFD corrects the phase error on the next and subsequent PFD cycles; consequently, the PFD performs a small misalignment of phase between CLK and REF and adds the charge lost to leakage on each cycle. Phase alignment is then lost. Since the voltage at VLF node 120 ramps up during PFD activation while adding charge lost to leakage and subsequently ramps down due to leakage, the VCO frequency is no longer stable and frequency lock is lost.

At higher leakage, the PFD phase misalignment results in a gross oscillation in the VCO frequency, wherein the VCO frequency drifts lower while the PFD is not active and then runs up as the charge pump applies a long corrective current pulse. All this can occur while the digital logic in the design, the majority of the die functionality, performs flawlessly. Therefore, process monitors that are adequate for ensuring that digital circuits function properly are not always adequate for analog functions, and if large capacitors are involved, almost certainly not adequate. This problem is not evident in some manufacturing processes, because even relatively large digital logic devices (for which process monitors may be able to detect failure modes) adversely impact analog designs. However, as digital logic transistors have scaled with process dimensions, they have moved away from analog devices in size by dramatic proportions; thus, the methods for measuring acceptable processing for analog and digital integrated circuitry have diverged.

Figures 1, 2:
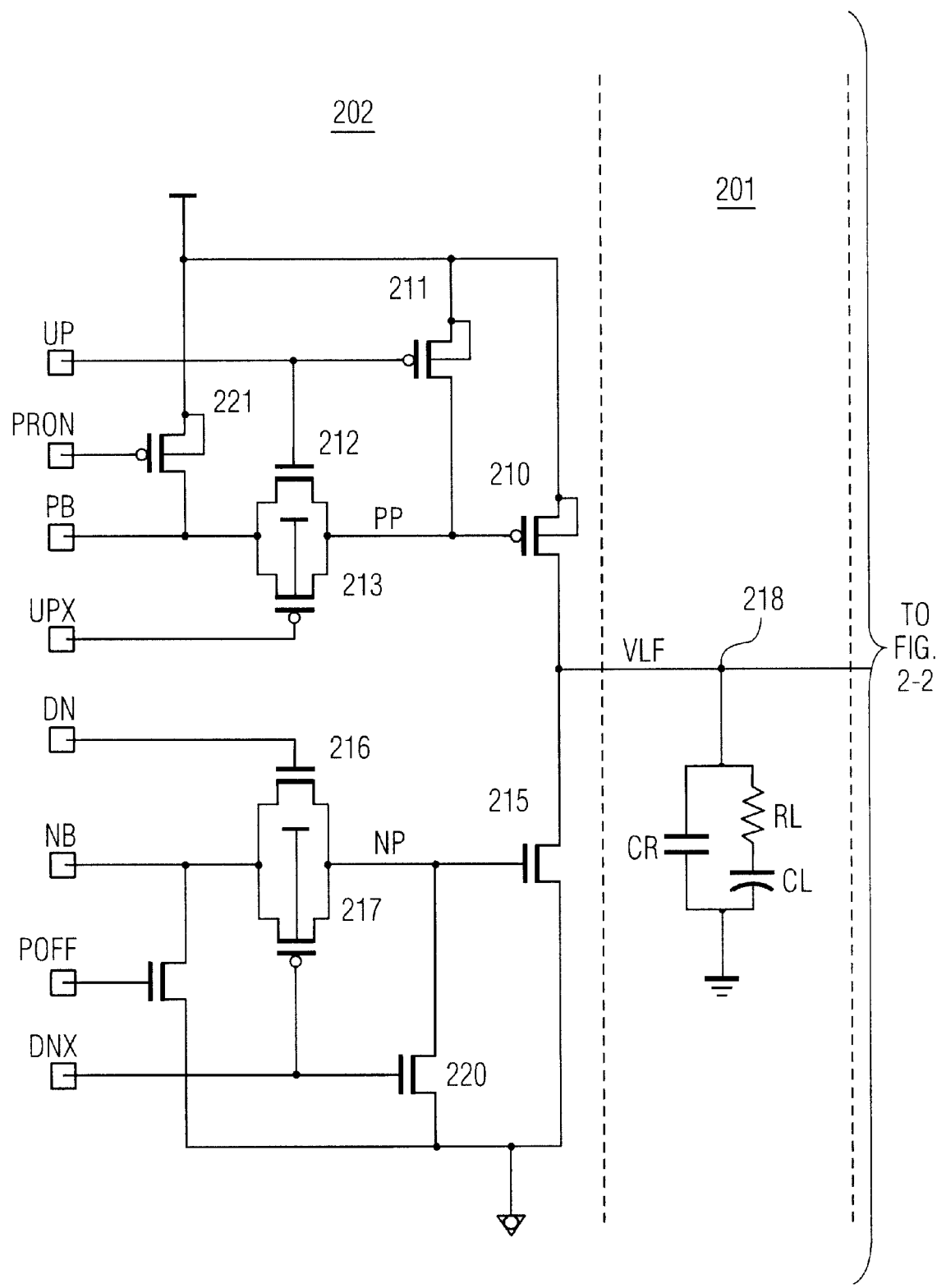
FIG. 2 is a circuit diagram of an example PLL circuit that is consistent with the circuit of FIG. 1 and is also in accordance with the present invention.
Figure 2:
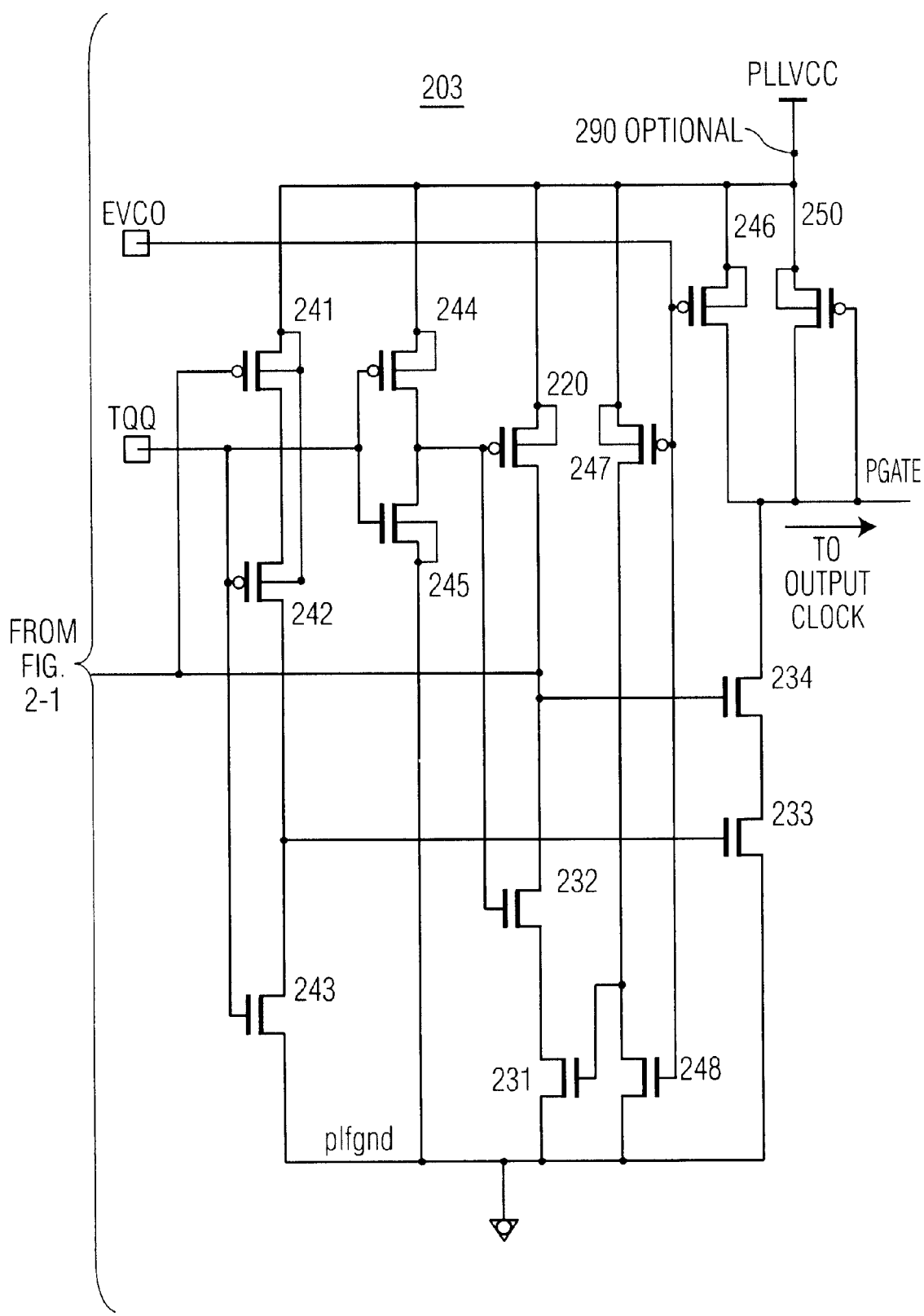

Referring now to FIG. 2, a detailed circuit is shown as an example implementation of the PLL circuit of FIG. 1. FIG. 2 shows a conventional loop filter 201, the output stage of a conventional charge pump 202, and the input of a VCO Block 203. The PFD error pulses to the charge pump 202 are differential, with UPX being the complement of UP and DNX being the complement of DN.

In the charge pump area of FIG. 2, the PFD pulses on signals UP and UPX control the operation of transistor 210. When active, the UP signal turns off transistor 211 and turns on transistor 212; at the same time, UPX turns on transistor 213. This action provides a bias voltage from node PB to node PP to bias the transistor 210 so that it pumps current to node 218 for the loop voltage VLF. When the UP and UPX pulses end, transistors 212 and 213 are turned off while transistor 211 turns on to turn off transistor 210. In similar fashion, the PFD pulses DN and DNX control operation of transistor 215. When active the DN signal turns on transistor 216 while DNX turns on transistor 217 and turns off transistor 220. This enables the bias voltage at node NB to transfer to node NP, biasing transistor 215 to remove the designed current out of the loop voltage VLF. When the DN and DNX pulses end, transistor 216 and 217 are turned off, and transistor 220 turns on to turn off transistor 215.

When the UP pulse width is greater than the DN pulse width, the voltage at VLF node 120 is pulled up toward the high supply voltage PLLVCC, thereby increasing the VCO bias current and frequency at CLKO output. Conversely, when the DN pulse width exceeds the UP pulse width, the voltage at VLF node 120 is pulled down toward the low supply voltage PLLGND, thereby reducing the VCO bias current and frequency at CLKO output. When the PLL is in perfect phase lock, both UP and DN exhibit very narrow pulses and have equal width. In this condition no net charge is added or removed from the VLF node 120. In normal operation at startup, through a series of current pulses (one in each PFD cycle) the loop voltage at VLF node 120 is eventually charged to the voltage level that minimizes the pulse widths of both UP and DN from the PFD. For a lossless filter capacitor, this occurs only at the desired VCO frequency.

Signal PRON controls transistor 221 as well as other devices in the PLL. When PRON is high and its complement POFF is low, the PLL functions normally. When PRON is low (and POFF is high) the PLL is shut down into a low-leakage, non-operational state to conserve power. In the charge pump this is performed by turning on transistors 213 and 221 to disable the bias voltages at nodes NB and PB. PRON also disables the PFD circuit, so that UP and DN are low and UPX and DNX are high (inactive states for all four signals).

The primary elements of the passive loop filter 201 are the loop capacitor CL and resistor RL. The capacitance CR is a smaller secondary component that smoothes the voltage at the VLF node 218. Each of the capacitive devices CL and CR are built using thin gate oxide for maximum capacitance per unit area. The actual devices are implemented as an array of smaller components for the ease of physical design and for other purposes, such as limiting undesired parasitic characteristics like series resistance in the gate material. Such series resistance would have little effect on the operation of the capacitive device because of the presence of the resistor RL, but could change the performance of the capacitive device CR since it has no series resistor to mask its parasitic capacitance paths.

The PLL circuit of FIG. 2 further includes nodes TQQ and EVCO. As with other test inputs to the circuit, programmed test equipment is used to present signals to nodes TQQ and EVCO. In normal operation, node TQQ is low and node EVCO is high, with transistor 234 providing the current that properly biases the VCO for the desired output frequency at CLKO output. In the normal powerdown (zero-current state) mode, the EVCO signal and transistor 248 pull node enx low. This allows the charge pump, through its series of current pulses, to raise the VLF node 120 up to the voltage that will generate a current in transistor 234 that properly biases the VCO for the desired output frequency at the CLKO output. The EVCO signal is controlled by the PRON signal, so when PRON is low (and POFF is high) the EVCO signal is also driven low, thereby turning off transistor 248 and turning on transistors 246 and 247. Transistor 247 then drives node enx high so that transistor 231 discharges the loop voltage at node 120. This action turns off transistor 234 and allows transistor 246 to pull node PGATE up to the high power supply, PLLVCC, thereby turning off all PMOS devices in the VCO and placing the entire VCO block 122 into a zero-current state. The output CLKO is held at the low power supply voltage, PLLGND, and, when PRON is low, the loop filter capacitors have no voltage stress in this zero-current state. With TQQ low, the transistor 244 drives node qqx high, which turns on transistor 232, enabling the discharge of the loop voltage through transistor 231. Also, node qq2 is driven high since nodes VLF and TQQ are low, so transistor 241 and 242 are turned on and transistor 243 is turned off.

When the capacitor test control TQQ is driven high while EVCO is held low (and PRON is low and POFF is high to the charge pump), TQQ turns on transistor 243 to pull node qq2 to node PLLGND. This shuts off transistor 233 so that transistor 234 conducts no current regardless of its gate voltage (VLF). Also, TQQ turns on transistor 245 and turns off transistor 244, dropping node qqx low, which shuts off transistor 232 and turns on transistor 220. This allows transistor 220 to charge the VLF node 120 to the upper supply voltage while disabling other paths that might draw current from VLF node 120 (and while the rest of the PLL is in a zero-current state). After the VLF node 120 is fully charged, the leakage current for the PLL can be measured and compared with the leakage current measured under normal powerdown conditions (PRON low and POFF high). Such measurements can be made using a number of conventional techniques, including an ammeter 290 in series with a laboratory supply connected to the supply voltage PLLVCC, or by using the ammeter built into an automated tester (by providing an isolated supply to the PLLVCC power supply) to include in production tests.

If a significant change is measured (e.g., greater than about 10–20%)), then the gate oxide in the loop capacitor is suspect, depending on the expected allowable change for a low-leakage capacitor. Depending on the size of the capacitor under test, some pass/fail criteria are established relative to a threshold (defined as corresponding to normal operating conditions) to screen PLL blocks that are likely to fail due to leakage. Biasing the loop capacitor at the full power supply voltage is advantageous in that it ensures that this capacitor structure receives the maximum stress during testing. This is important for screening weak parts that become field failures.

For noise isolation reasons, using the capacitors. in the PLL loop filter (or similar capacitors in other analog structures) in a complex mostly-digital integrated circuit is advantageous. This is because the PLLVCC power line, which has its own isolated package pin, is isolated from other power lines within the integrated circuit. Therefore, the leakage measured will include only the leakage from other circuits within the analog portion of the PLL. Any marginal leakage behavior in the rest of the integrated circuit appears at different supply pins, and therefore does not mask the leakage that is to be measured.

The various embodiments described above are provided by way of illustration only and are not intended to limit the invention. Those skilled in the art will readily recognize various modifications and changes that may be made to the present invention without strictly following the example embodiments and applications illustrated and described herein. For example, the capacitive device discussed above can take on many different forms and may include a plurality of device types. The scope of the present invention is set forth in the following claims.

What is claimed is:

1. A method for testing dielectric integrity in an integrated circuit having at least one capacitive device coupled between two terminals and coupled to a current-sensitive node in the integrated circuit, comprising:
   in a test mode, stressing said at least one capacitive device by presenting a voltage differential across the two terminals;
   isolating the current-sensitive node from other current paths;
   measuring the leakage current at the current-sensitive node;
   comparing the measured leakage current at the current-sensitive node with a reference level and determining therefrom a quality factor indicative of the dielectric integrity in said at least one capacitive device.

2. A method for testing dielectric integrity in an integrated circuit, according to claim 1, wherein isolating the current-sensitive node from other current paths includes isolating the capacitive device coupled between the two terminals.

3. A method for testing dielectric integrity in an integrated circuit, according to claim 1, wherein measuring the leakage current at the current-sensitive node includes determining the integrity of an oxide dielectric in the capacitive device between the two terminals.

4. A method for testing dielectric integrity in an integrated circuit, according to claim 1, wherein isolating the current-sensitive node from other current paths includes isolating the other current paths from drawing current from said at least one capacitive device.

5. A method for testing dielectric integrity in an integrated circuit, according to claim 4, wherein said at least one capacitive device includes at least two capacitors.

6. A method for testing dielectric integrity in an integrated circuit, according to claim 5, wherein said at least one capacitive device includes at least one resistor.

7. A method for testing dielectric integrity in an integrated circuit, according to claim 1, wherein said at least one capacitive device includes at least one resistor.

8. A method for testing dielectric integrity in an integrated circuit, according to claim 1, wherein stressing includes presenting the voltage across the two terminals that is comparable to a supply voltage.

9. A method for testing dielectric integrity in an integrated circuit, according to claim 1, further including determining the reference level as function of a high impedance specification.

10. A method for testing dielectric integrity in a phase-locked loop (PLL) capacitor circuit that form s part of controlled oscillator PLL circuit having a test mode, the PLL capacitor circuit having at least one capacitive device coupled between two terminals and coupled to a current-sensitive node in the controlled oscillator PLL circuit, the method comprising:
   causing the controlled oscillator PLL circuit to enter the test mode;
   while in the test mode; stressing said at least one capacitive device by presenting a voltage differential across the two terminals;
   isolating the current-sensitive node from other current paths;
   measuring the leakage current at the current-sensitive node;

comparing the measured leakage current at the current-sensitive node with a reference level and determining therefrom a quality factor indicative of the dielectric integrity in said at least one capacitive device.

11. A method for testing dielectric integrity in a phase-locked loop (PLL) capacitor circuit, that forms part of controlled oscillator PLL circuit having a test mode, the PLL capacitor circuit having at least one capacitive device coupled between two terminals and coupled to a current-sensitive node in the controlled oscillator PLL circuit, the method comprising:

causing the controlled oscillator PLL circuit to enter the test mode;

while in the test mode; stressing said at least one capacitive device by presenting a voltage differential across the two terminals, wherein stressing includes presenting the voltage across the two terminals that is comparable to a supply voltage;

isolating the current-sensitive node from other current paths;

measuring the leakage current at the current-sensitive node; and comparing the measured leakage current at the current-sensitive node with a reference level and determining therefrom a quality factor indicative of the dielectric integrity in said at least one capacitive device.

12. A method for testing dielectric integrity in a phase-locked loop (PLL) capacitor circuit, that forms part of controlled oscillator PLL circuit having a test mode, the PLL capacitor circuit having at least one capacitive device coupled between two terminals and coupled to a current-sensitive node in the controlled oscillator PLL circuit, the method comprising:

causing the controlled oscillator PLL circuit to enter the test mode; while in the test mode; stressing said at least one capacitive device by presenting a voltage differential across the two terminals, wherein the current-sensitive node drives a voltage controlled oscillator;

isolating the current-sensitive node from other current paths;

measuring the leakage current at the current-sensitive node; and comparing the measured leakage current at the current-sensitive node with a reference level and determining therefrom a quality factor indicative of the dielectric integrity in said at least one capacitive device.

13. A method for testing dielectric integrity in a phase-locked loop (PLL) capacitor circuit, that forms part of controlled oscillator PLL circuit having a test mode, the PLL capacitor circuit having at least one capacitive device coupled between two terminals and coupled to a current-sensitive node in the controlled oscillator PLL circuit, the method comprising:

causing the controlled oscillator PLL circuit to enter the test mode; while in the test mode; stressing said at least one capacitive device by presenting a voltage differential across the two terminals, wherein isolating the current-sensitive node from other current paths includes disabling the voltage controlled oscillator;

isolating the current-sensitive node from other current paths;

measuring the leakage current at the current-sensitive node; and comparing the measured leakage current at the current-sensitive node with a reference level and determining therefrom a quality factor indicative of the dielectric integrity in said at least one capacitive device.

14. A method for testing dielectric integrity in a phase-locked loop (PLL) capacitor circuit, that forms part of controlled oscillator PLL circuit having a test mode, the PLL capacitor circuit having at least one capacitive device coupled between two terminals and coupled to a current-sensitive node in the controlled oscillator PLL circuit, the method comprising:

causing the controlled oscillator PLL circuit to enter the test mode; while in the test mode; stressing said at least one capacitive device by presenting a voltage differential across the two terminals, wherein said at least one capacitive device includes at least one resistor;

isolating the current-sensitive node from other current paths;

measuring the leakage current at the current-sensitive node; and comparing the measured leakage current at the current-sensitive node with a reference level and determining therefrom a quality factor indicative of the dielectric integrity in said at least one capacitive device.

15. A method for testing dielectric integrity in a phase-locked loop (PLL) capacitor circuit, that forms part of controlled oscillator PLL circuit having a test mode, the PLL capacitor circuit having at least one capacitive device coupled between two terminals and coupled to a current-sensitive node in the controlled oscillator PLL circuit, the method comprising:

causing the controlled oscillator PLL circuit to enter the test mode; while in the test mode; stressing said at least one capacitive device by presenting a voltage differential across the two terminals, wherein said at least one capacitive device further includes two capacitors;

isolating the current-sensitive node from other current paths;

measuring the leakage current at the current-sensitive node; and comparing the measured leakage current at the current-sensitive node with a reference level and determining therefrom a quality factor indicative of the dielectric integrity in said at least one capacitive device.

16. An arrangement for testing dielectric integrity in a phase-locked loop (PLL) capacitor circuit that forms part of controlled oscillator PLL circuit having a test mode, the PLL capacitor circuit having at least one capacitive device coupled between two terminals and coupled to a current-sensitive node in the controlled oscillator PLL circuit, the arrangement comprising:

means for causing the controlled oscillator PLL circuit to enter the test mode;

means for stressing said at least one capacitive device and presenting a voltage differential across the two terminals;

means for isolating the current-sensitive node from other current paths;

means for measuring the leakage current at the current-sensitive node, wherein the measured leakage current at the current-sensitive node is compared with a reference level and therefrom a quality factor is determined that is indicative of the dielectric integrity in said at least one capacitive device.

17. An arrangement for testing dielectric integrity in a phase-locked loop (PLL) capacitor circuit, according to claim 16, wherein said means for stressing said at least one capacitive device includes a voltage source.

18. An arrangement for testing dielectric integrity in a phase-locked loop (PLL) capacitor circuit, according to claim 17, wherein the voltage source includes a voltage differential that is comparable to a supply voltage for the PLL circuit.

19. An arrangement for testing dielectric integrity in a phase-locked loop (PLL) capacitor circuit, according to claim 18, wherein said at least one capacitive device includes at least two capacitors and one resistor.

20. An arrangement for testing dielectric integrity in a phase-locked loop (PLL) capacitor circuit, according to claim 19, wherein said at least one capacitive device includes an oxide dielectric between the two terminals.

* * * * *